[12] United States Patent
Sandhu et al.

(10) Patent No.: US 10,191,527 B2
(45) Date of Patent: Jan. 29, 2019

(54) BROWN-OUT DETECTOR

(71) Applicant: ARM Limited, Cambridge (GB)

(72) Inventors: Bal S. Sandhu, San Jose, CA (US); James Edward Myers, Cambridge (GB)

(73) Assignee: ARM Limited, Cambridge (GB)

( * ) Notice: Subject to any disclaimer, the term of this patent is extended or adjusted under 35 U.S.C. 154(b) by 526 days.

(21) Appl. No.: 14/712,614

(22) Filed: May 14, 2015

(65) Prior Publication Data

US 2016/0334470 A1    Nov. 17, 2016

(51) Int. Cl.
| | |
|---|---|
| *G01R 31/40* | (2014.01) |
| *G01R 19/165* | (2006.01) |
| *G06F 1/28* | (2006.01) |
| *G01R 19/32* | (2006.01) |

(52) U.S. Cl.
CPC ......... *G06F 1/28* (2013.01); *G01R 19/16552* (2013.01); *G01R 19/32* (2013.01)

(58) Field of Classification Search
None
See application file for complete search history.

(56) References Cited

U.S. PATENT DOCUMENTS

| | | | | |
|---|---|---|---|---|
| 4,675,594 | A  * | 6/1987 | Reinke | G05F 1/561 |
| | | | | 323/317 |
| 7,671,677 | B2 * | 3/2010 | Kindt | H03F 1/34 |
| | | | | 330/258 |
| 9,182,770 | B2 * | 11/2015 | Groeneweg | G05F 1/575 |
| 2002/0030536 | A1 * | 3/2002 | Chowdhury | G05F 3/30 |
| | | | | 327/539 |
| 2004/0239413 | A1 * | 12/2004 | Gubbins | H03K 17/145 |
| | | | | 327/539 |
| 2011/0185212 | A1 * | 7/2011 | Dao | G01R 19/16519 |
| | | | | 713/340 |
| 2014/0097873 | A1 * | 4/2014 | Shi | H03K 17/223 |
| | | | | 327/90 |

\* cited by examiner

*Primary Examiner* — Jermele M Hollington
(74) *Attorney, Agent, or Firm* — Pramudji Law Group PLLC; Ari Pramudji

(57) ABSTRACT

Various implementations described herein are directed to an integrated circuit for brown-out detection. The integrated circuit may include a first stage configured to receive an input voltage and provide a first voltage independent of temperature while remaining related to the input voltage. The integrated circuit may include a second stage configured to receive the input voltage, receive the first voltage from the first stage, and up-convert the first voltage as input voltage lowers. The second stage may be configured to provide a second voltage corresponding to a differential voltage of the input voltage and the first voltage. The integrated circuit may include a third stage configured to receive the second voltage and provide a high-gain output voltage corresponding to an error signal.

15 Claims, 3 Drawing Sheets

BROWN-OUT DETECTOR

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits include circuitry to perform monitoring functions to assist with detecting whether a power supply has reached low power levels. Sometimes, integrated circuits are subject to insufficient power availability, and protection may be achieved with a type of circuit known as a brown-out detector (BOD).

FIG. 1 shows an example of a BOD circuit. In this circuit, first and second reference voltages are compared with an analog comparator circuit. The first reference voltage Vtr is a BOD trigger voltage that is set by supply voltage VDD and a ratio of resistors R1 and R2. The second reference voltage Vz is a Zener diode voltage that is independent of the supply voltage VDD and is set using an external Zener diode. Another resistor R3 is used to provide bias current to the Zener diode. As VDD goes low, the trigger voltage Vtr decreases based on a ratio of R1 and R2. When the trigger voltage Vtr becomes equal to or less then the Zener diode voltage Vz, the BOD circuit output goes high to indicate an error condition has occurred due to insufficient supply voltage. This error signal is given to a system power management controller to take action and save contents of memory and registers to main memory.

Unfortunately, some problems with conventional BOD circuits include situations where reference voltages that are used for comparison to monitor the supply voltage VDD can consume high DC current and continuously draw current from the supply. This current can be several hundred microamps (µA) to several milli-amps (mA). For example, some conventional BOD circuits consume currents within a 100 µA to over 1 mA range. Another problem with conventional BOD circuits is that, as supply voltages continue to scale, the Zener diode reference becomes more difficult to scale.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to circuitry for brown-out detection. For instance, in one implementation, such circuitry may refer to a nano-power brown-out detector (BOD) for power supply power management, including, e.g., battery supply power management. Such circuitry may provide nano-power BOD circuitry with substantially small area and consuming significantly lower power than conventional schemes. Further, such circuitry may relate to an on-chip power monitoring system in a memory controller unit (MCU) that is configured to monitor and detect power supply levels, including, e.g., battery power supply levels. For instance, when power supply levels fall to a pre-determined insufficient value, the BOD circuit may be configured to generate an error signal to notify a computing device or system that the power supply level is falling dangerously low. As such, this brown-out detector (BOD) circuitry may be a critical component for highly integrated computing systems, e.g., microcontrollers. Still further, receiving this early warning error signal may allow the computing device or system to start saving a current state of memory and program operation (e.g., instruction pipeline, stack-pointers, etc.) or to start disabling some operations, such as, e.g., firmware updates. Sometimes, without a BOD circuit to monitor power supply levels during times of low power supply levels, the MCU may start writing random values into registers and memory thereby corrupting the memory values and program execution.

Various implementations of brown-out detector (BOD) circuitry described herein will now be described in more detail with reference to FIGS. 2-3.

Figure 1:
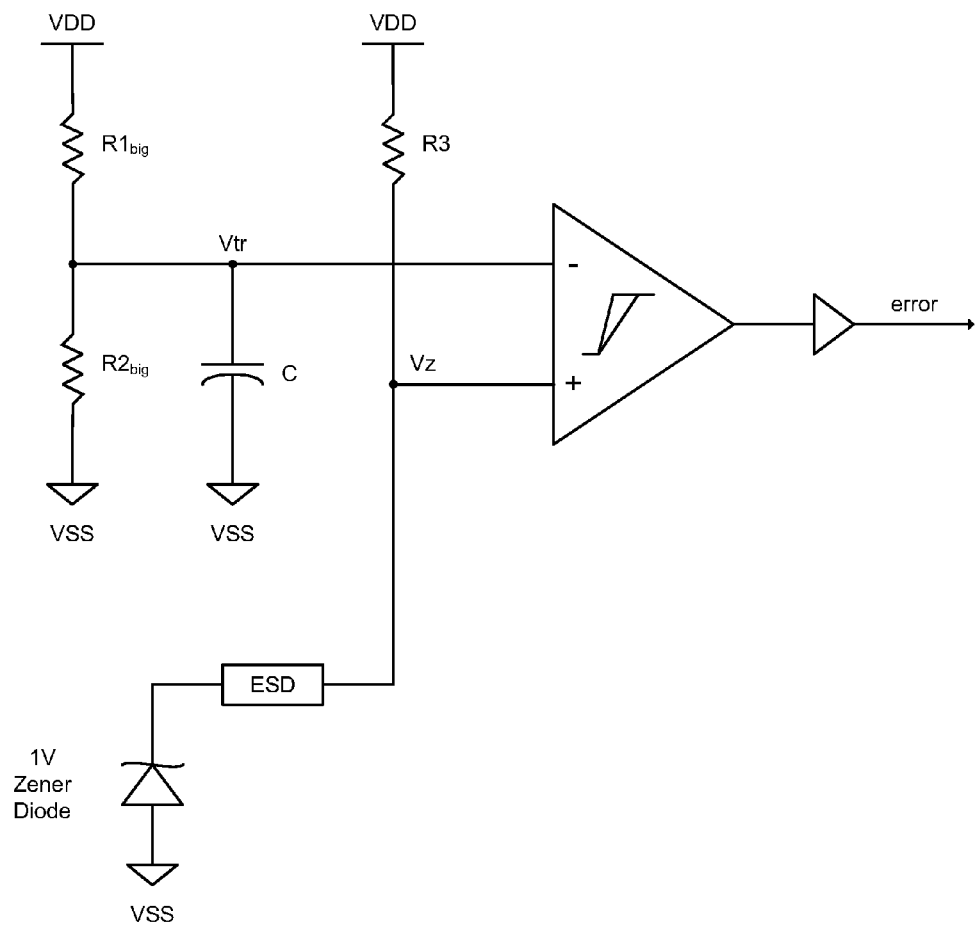
FIG. 1 illustrates a diagram of BOD circuitry as known in the art.
Figure 2:
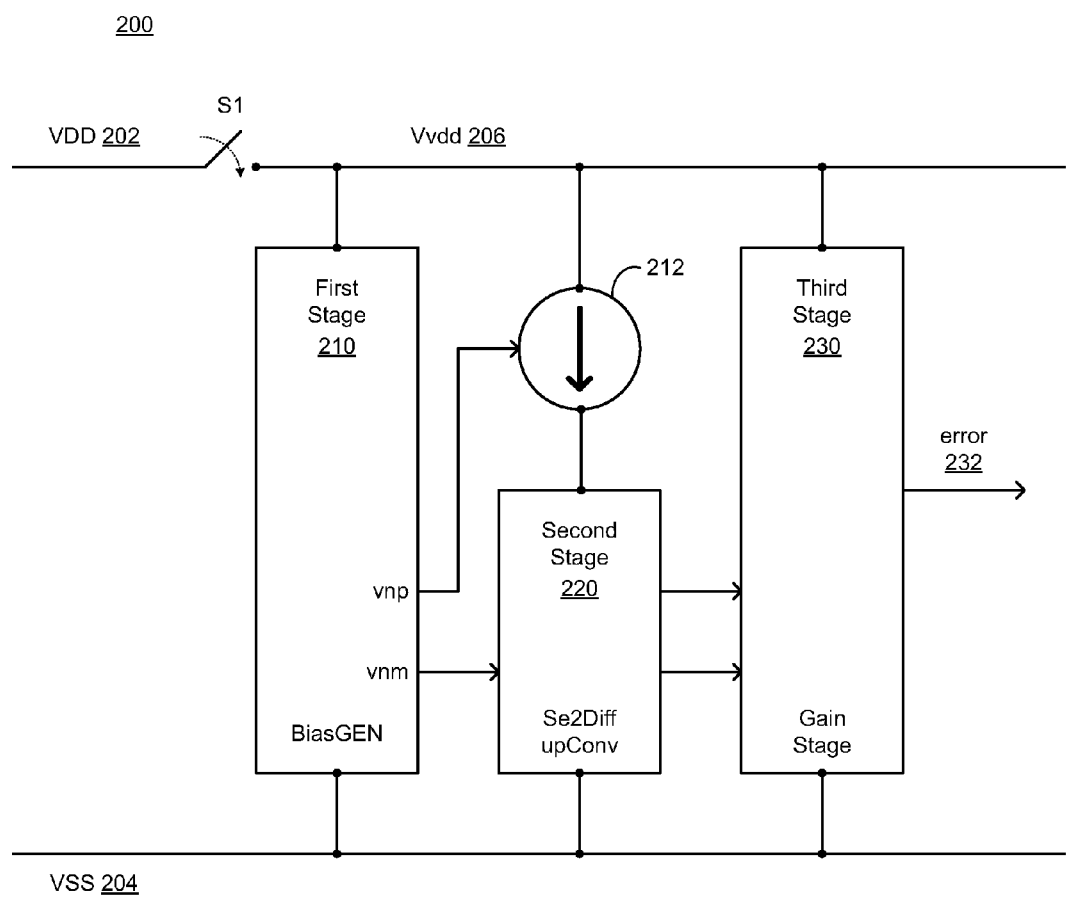
FIG. 2 illustrates a block diagram of BOD circuitry in accordance with various implementations described herein.

FIG. 2 illustrates a block diagram of brown-out detector (BOD) circuitry 200 in accordance with various implementations described herein. The BOD circuitry 200 may be implemented as an integrated circuit with multiple stages and may be referred to as a BOD circuit. In some implementations, the multiple stages may be referred to as multiple sub-divided circuit portions having interdependent relationship.

The circuitry 200 may include a first bus 202 configured to provide an input voltage VDD, which may be referred to as a supply voltage, an input voltage, or an input signal. The first bus 202 may be referred to as a first voltage rail for supplying power (i.e., input voltage VDD) to the BOD circuit from an input voltage source, such as, e.g., a battery power source. The circuitry 200 may include a second bus 204 configured to provide a ground voltage GND or VSS. The second bus 204 may be referred to as a second voltage rail for providing the ground voltage GND or VSS to the BOD circuit.

The circuitry 200 may include an electrical switching mechanism configured to operate as a switch S1 for use as a power gating element. In some instances, the switch S1 may be configured to provide input voltage VDD to the circuitry 200 when the switch S1 is activated, and the switch S1 may be configured to withhold input voltage VDD from the circuitry 200 when the switch S1 is deactivated. Further, in some instances, the switch S1 may be configured to duty cycle input voltage VDD to the circuitry 200 when the switch S1 is cycled through alternating activation and deactivation over a period of time. In some other instances, the switch S1 may serve to provide a virtual input voltage Vvdd to the circuitry 200 via a virtual voltage rail or bus 206, which may be part of the first bus 202.

The BOD circuitry 200 may include a first stage 210, a second stage 220, and a third stage 230. The first stage 210 may be referred to as a bias generation (biasGEN) stage interposed between the first bus 202 for connection to the supply voltage VDD (or Vvdd) and the second bus 204 for connection to the ground voltage VSS. The first stage 210 may be configured to provide a triggering voltage (vnp) to the second stage 220. For instance, the first stage 210 may be configured to provide the triggering voltage (vnp) for the BOD circuitry 200 to generate an error signal 232 when the input voltage VDD drops to a level at or below the desired target trip voltage. In some implementations, the desired trip voltage may refer to a voltage that the input voltage VDD is allowed to fall to before the error signal is generated. In some instances, the desired trip voltage may be higher than vnp. In some other instances, the desired trip voltage may always be higher than vnp Further, the first stage 210 may be configured to provide the triggering voltage (vnp) that is independent of temperature. Still further, in some instances, the first stage 210 may be configured to provide an output reference current that is independent of temperature and which may be copied as a current source 212 to the second stage 212. The first stage 210 is described in more detail herein below in reference to FIG. 3.

The second stage 220 may be referred to as a single-ended to differential up-converter (Se2Diff upConv) stage interposed between the first bus 202 for connection to the supply voltage VDD (or Vvdd) and the second bus 204 for connection to the ground voltage VSS. The second stage 220 may be configured to use a temperature independent current from the first stage 210 to provide a constant ultra-low current to power the second stage 220. In some instances, this may keep the current consumption of the BOD circuitry 200 substantially low. Thus, in some instances, the second stage 220 may be configured to use a temperature independent voltage and/or a temperature independent current via current mirrors formed with transistors M7, M10 to drive transistors M13, M16, as shown and described further below with reference to FIG. 3. Various other components of the second stage 220 are also described below with reference to FIG. 3.

The third stage 230 may be referred to as a gain stage interposed between the first bus 202 for connection to the supply voltage VDD (or Vvdd) and the second bus 204 for connection to the ground voltage VSS. The third stage 230 may be configured to amplify the differential voltage signal generated by the second stage 220 to a full rail-to-rail voltage level and to drive the output signal to a capacitive load. In some instances, without the third stage 230, the BOD circuitry 200 may use more current due to the output from the second stage 220 driving into a digital load, which may not be rail-to-rail. The third stage 230 is described in further herein below in reference to FIG. 3.

In some implementations, the supply voltage VDD may be configured to provide an input voltage of approximately 1.2V. In other implementations, the supply voltage VDD may be configured to provide an input voltage within a range of approximately 1.0V to 3.3V. As described herein, each stage may be configured to utilize one or more circuit components that may be configured for operating together to perform brown-out detection. In some implementations, the supply voltage VDD may not be less than about 1.0V, when using a thick-gate transistor, because the circuit may be configured to trip when the source voltage VDD falls to, for example, about 0.9V.

Figure 3:
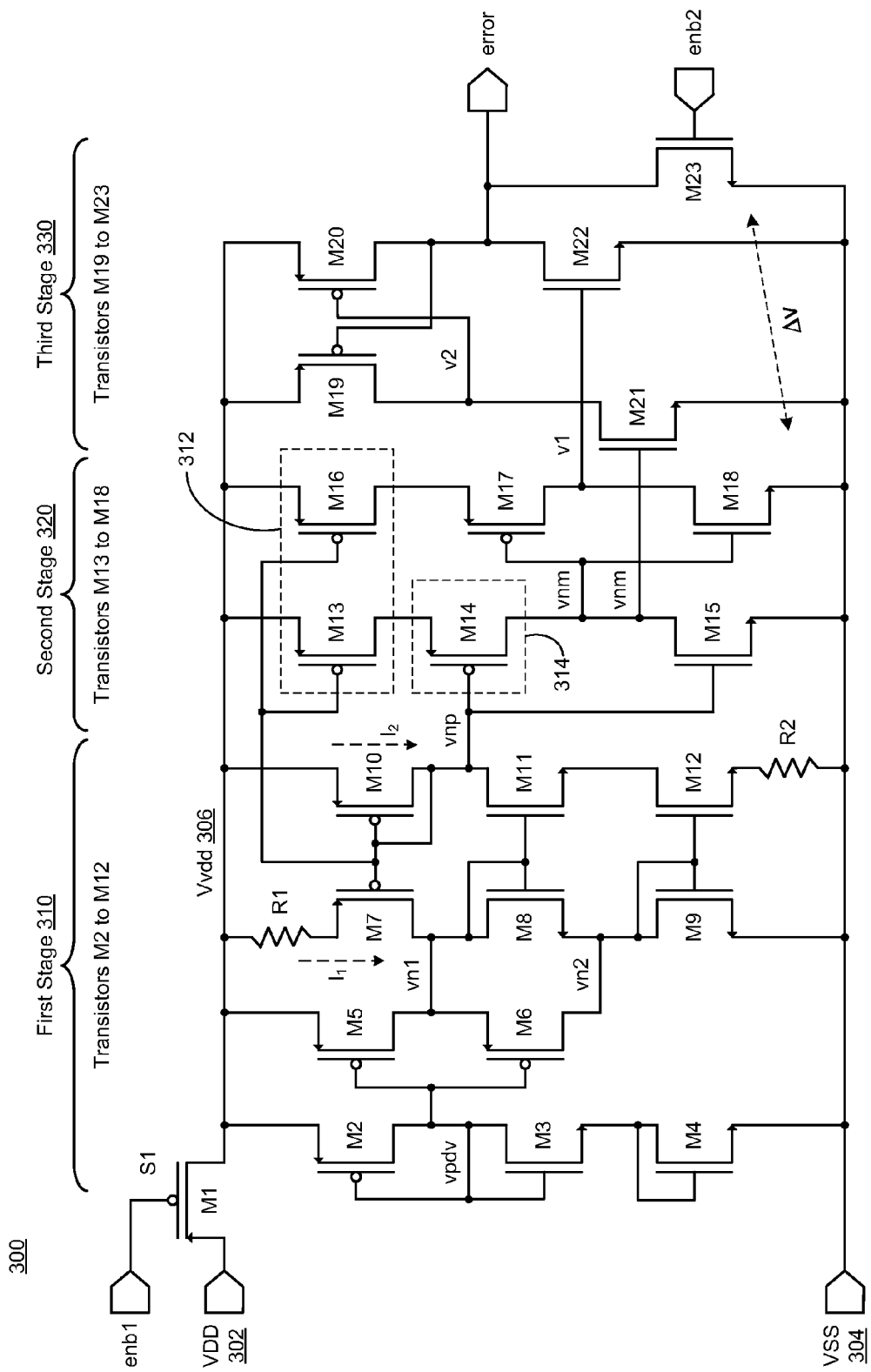
FIG. 3 illustrates a schematic diagram of a BOD circuit in accordance with various implementations described herein.

FIG. 3 illustrates a schematic diagram of BOD circuit 300 in accordance with various implementations described herein. As shown in FIG. 3, the BOD circuit 300 may be implemented as an integrated circuit with multiple stages and may be referred to as BOD circuitry. Further, the multiple stages may be referred to as multiple sub-divided circuit portions having interdependent relationship.

As mentioned above, the BOD circuit 300 may be configured as a nano-power brown-out detector for power supply management, including, e.g., battery supply power management. Further, in some implementations, a layout size of a cell having the BOD circuit 300 may be small and occupy an area of ~975 sq·um.

The BOD circuit 300 may include a first bus 302 configured to provide a first voltage supply signal, such as an input supply voltage VDD or signal. The circuit 300 may include a second bus 304 configured to provide a second voltage supply signal, such as a ground voltage VSS or signal. Further, the circuit 300 may include a first transistor M1 configured to operate as a switch S1 for use as a power gating element via first enable signal (enb1) provided to a gate of the first transistor M1. The first transistor M1 may be referred to as an input transistor to the BOD circuit 300. The switch S1 may be configured with similar functionality as described in reference to switch S1 of FIG. 2. For instance, the first transistor M1 may be configured as an input transistor to provide input voltage VDD to the first stage 310 when the first transistor M1 is activated, and the first transistor M1 may be configured to withhold (or disable or cut-off) input voltage VDD from the first stage 310 when the first transistor M1 is deactivated.

In some implementations, the first transistor M1 may include a p-type metal-oxide-semiconductor (PMOS) transistor (that is active low) and may be configured to duty cycle the input voltage VDD (powering on and off) to the first stage 310 when the first transistor M1 is cycled through alternating activation (on) and deactivation (off) over a period of time. The input transistor M1 may be used for power gating the BOD circuit 300 for duty cycling or for placing into sleep mode (e.g., power-down mode). This duty cycling of the first transistor M1 may serve to reduce current drawn by the BOD circuit 300 from the input voltage supply. Further, as shown in FIG. 3, the first transistor M1 may be configured to receive the first enable signal (enb1) on a gate thereof. In some instances, the first transistor M1 may serve to provide a virtual input voltage Vvdd to the BOD circuit 300 via a virtual voltage rail or bus 306, which may be part of the first bus 302.

In reference to FIG. 3, the BOD circuit 300 may include a first stage 310, a second stage 320, and a third stage 330. In some implementations, the first stage 310 may be referred to as a bias generation stage. The first stage 310 may include a first plurality of transistors M2-M12 and a plurality of resistors R1-R2 arranged to receive input voltage VDD and provide a first voltage or triggering voltage (vnp) that is substantially independent of temperature while remaining related to the input voltage VDD.

In some implementations, the first stage 310 may be configured as a bias generator that is configured to achieve non-power operation by biasing the first plurality of transistors M2-M12 in sub-threshold using thick-gate transistors that are driven by input voltage VDD (e.g., driven by a ~1.2V voltage supply rail). Further, in some instances, to reduce current consumption, the BOD circuit 300 may use thick-gate input/output (I/O) transistors (e.g., instead of thin-gate core transistors) to cut leakage currents in the BOD circuit 300. Even though thin-gate core transistors may be used, if used, the BOD circuit 300 may suffer from substantially higher leakage current as well as more process variation. Further, in some instances, the resistors R1-R2 may include un-salicided poly resistors with a high-sheet resistance value (e.g., ~690 ohms/sq). In other instances, the resistors R1-R2 may have positive temperature coefficients to offset negative temperature coefficients of a threshold voltage of seventh transistor M7 and twelfth transistor M12 of the first plurality of transistors M2-M12. As such, the output voltage (vnp) of the first stage 310 may be approximately independent of temperature, while being a function of or at least related to the input voltage VDD supply.

In some implementations, the temperature independent voltage (vnp) provided by the bias generator (i.e., first stage 310) may be given by:

$$Vnp \sim Vthn + (VDD - 2Vthn - Vd_{satp}) \cdot R2/R1$$

where Vthn is a threshold voltage of a thick-gate n-type FET and $Vd_{satp}$ is a saturation voltage across a p-type FET. In this instance, a sub-threshold current for the second stage 320 may be configured to perform an up-conversion from the output voltage or triggering voltage (vnp) of the first stage 310.

As shown in FIG. 3, the first transistors M2-M12 of the first stage 310 may include one or more n-type metal-oxide-semiconductor (NMOS) transistors and/or one or more p-type metal-oxide-semiconductor (PMOS) transistors including, e.g., field-effect transistors (FETs). The first transistors M2-M12 may include a second transistor M2 (PMOS), a third transistor M3 (NMOS), a fourth transistor M4 (NMOS), a fifth transistor M5 (PMOS), a sixth transistor M6 (PMOS), a seventh transistor M2 (PMOS), an eighth transistor M8 (NMOS), a ninth transistor M9 (NMOS), a tenth transistor M10 (PMOS), an eleventh transistor M11 (NMOS), and a twelfth transistor M12 (NMOS).

In some implementations, the first stage 210 may include a first circuit portion having a first resistor R1 of the resistors R1-R2 and the seventh transistor M7 of the first transistors M2-M12 arranged to provide a first current ($I_1$). The first stage 310 may include a second circuit portion having a second resistor R2 of the resistors R1-R2 and the twelfth transistor M12 of the first transistors M2-M12 arranged to provide a second current ($I_2$) that mirrors the first current ($I_1$). Further, in some instances, a threshold voltage variation of the first and second currents ($I_1$, $I_2$) may be cancelled out by the first resistor R1 being connected between the first voltage rail Vvdd supplying the input voltage VDD and the seventh transistor M7 and, further, by the second resistor R2 being connected between a second voltage rail VSS supplying a ground voltage and the twelfth transistor M12. In some instances, in reference to the current mirrors ($I_1$, $I_2$), the current in two branches (e.g., the first current $I_1$ across the seventh transistor M7, and the second current $I_2$ across the tenth transistor M10) in the current mirror of the first stage 310 may be equal or at least similar, where, e.g., $I_1$ (M7)~$I_2$ (M10).

Referring to FIG. 3, the second stage 320 may be referred to as a differential up-converter stage. In some implementations, the second stage 320 may be configured to provide a single-ended to differential up-converter circuit. The second stage 320 may include a second plurality of transistors M13-M18 arranged to receive the input voltage VDD. Further, the second plurality of transistors M13-M18 may be arranged to receive the first voltage or triggering voltage (vnp) from the first stage 310 (at a gate thereof) and up-convert the first voltage (vnp) as the input voltage VDD lowers. The second stage 320 may follow an opposite conversion, and the two together may form a differential output voltage (Δv) that may be used to drive the third stage 330 (which may be referred to as a high-gain output stage) to generate the error signal (error). Further, the second stage 320 may be configured to provide a second voltage (vnm) corresponding to the differential voltage (Δv) of the input voltage VDD and the first voltage (vnp).

As shown in FIG. 3, the second transistors M13-M18 of the second stage 320 may include one or more NMOS transistors and/or one or more PMOS transistors including, e.g., FETs. The second transistors M13-M18 may include a thirteenth transistor M13 (PMOS), a fourteenth transistor M14 (PMOS), a fifteenth transistor M15 (NMOS), a sixteenth transistor M16 (PMOS), a seventeenth transistor M17 (PMOS), and an eighteenth transistor M18 (NMOS).

In some implementations, the second stage 320 may be configured to provide the second voltage (vnm) as a combination of the input voltage VDD and an up-converted first voltage (vnm) corresponding to the differential voltage (Δv), which may be used to drive the third stage 330 and provide a high-gain output voltage corresponding to the error signal (error). In reference to FIG. 3, the fourteenth transistor M14 may be configured and used as an up-converter 314. For instance, as described herein, the output voltage (vnp) of the first stage 310 may be up-converted 314 via the fourteenth transistor M14 as the input voltage VDD supply lowers or is lowered.

In some implementations, a current source 312 may be provided via thirteenth transistor M13 and sixteenth M16. Further, the current source 312 may correspond to the current source 212 of FIG. 2. As previously described herein, the first stage 310 may be configured to provide a triggering voltage (vnp) for the BOD circuit 300 to generate an error signal (error) when the input voltage VDD (or Vvdd) drops to a level at or below the triggering voltage (vnp). Due to the arrangement of the first transistors M2-M12, the triggering voltage (vnp) is substantially independent of temperature. The first stage 310 may be configured to provide an output reference current that is substantially independent of temperature and which may be copied to the second stage 320 as implemented with the current source 312. The second stage 320 may be configured as a single-ended to differential up-converter that uses a temperature independent current from the first stage 310 to provide a constant ultra-low current to power the second stage 320, thereby keeping the current consumption of the BOD circuit 300 substantially low. In this instance, the second stage 320 may be configured to use a temperature independent voltage (vnp) and a temperature independent current via current mirrors implemented with transistors M7, M10 to drive transistors M13, M16.

Referring to FIG. 3, the third stage 330 may be referred to as a gain stage, or in some instances, a high gain stage. For instance, the third stage 330 may be configured as a high-gain driver that swings rail-to-rail and may not consume DC current, or only a low amount of DC current. Thus, the third stage 330 may provide a capability to achieve the nano-power BOD circuit 300 that may consume only ~275 nA (e.g., at or at least close to an approximate upper boundary) at full rail input voltage VDD supply. As such, in some instances, DC current may drop exponentially to below ~30 nA at VDD=1.0V, which may be above a pre-determined trip voltage. For instance, across a temperature range from approximately 0° to 100° C., a BOD trip-point may be ~0.9V at room temperature, and in this instance, an upper boundary DC current draw from the input power supply may only be ~275 nA at ~1.2V.

In some implementations, the third stage 230 may include a third plurality of transistors arranged to receive the second voltage (vnm) and provide a high-gain output voltage corresponding to an error signal (error). As previously described herein, the third stage 330 may be configured and used to amplify the differential voltage signal (Δv) generated by the second stage 320 to a full rail-to-rail level and to drive the output signal (error) to a capacitive load. Without the third stage 330, the BOD circuit 300 may use more current due to the output voltage (vnp) from the second stage 320 driving into a digital load, which may not be rail-to-rail. Further, in some implementations, the third stage 330 may include an output transistor M23 that may be referred to as a power down transistor. For instance, the output transistor M23 may include a NMOS transistor (that is active high) configured to receive a second enable signal (enb2). In this arrangement, the output transistor M23 may be deactivated (off) when the BOD circuit 300 is activated (on). In some instances, the output transistor M23 may be used to ensure that the output signal (error) does not float when the BOD circuit 300 is powered down and when the first enable signal (enb1) is forced high, e.g., to logic one (1). In some implementations, the first enable signal (enb1) and the second enable signal (enb2) may be a same enable signal (enb), since it goes to PMOS transistor (M1) and NMOS transistor (M23). Hence, in some implementations, when enb=0, M1 is ON, but M23 is OFF, and when enb=1, M1 is OFF, and M23 is ON.

As shown in FIG. 3, the third transistors M19-M23 of the third stage 330 may include one or more NMOS transistors and/or one or more PMOS transistors including, e.g., FETs. The third transistors M19-M23 may include a nineteenth transistor M19 (PMOS), a twentieth transistor M20 (PMOS), a twenty-first transistor M21 (NMOS), a twenty-second transistor M22 (NMOS), and a twenty-third transistor M23 (NMOS). As described herein, the twenty-third transistor M23 may be implemented as the output transistor, which may be referred to as a power down transistor.

In some implementations, as described herein, the supply voltage VDD may be configured to provide an input voltage of approximately 1.2V. In other implementations, the supply voltage VDD may be configured to provide an input voltage within a range of approximately 1.0V to 3.3V. Further, in various implementations, each stage 310, 320, 330 of BOD circuit 300 may be configured to utilize one or more circuit components that may be configured for operating together to perform brown-out detection, in a manner as described herein. As previously described, in some implementations, the supply voltage VDD may not be less than about 1.0V, when using a thick-gate transistor, because the circuit may be configured to trip when the supply voltage VDD falls to, for example, about 0.9V.

In reference to system considerations, as described herein, implementing the enable signals (enb1, enb2) in the BOD circuit 300 allows for duty-cycling so that energy consumption may be reduced. Depending on energy source/storage used (e.g., coin cell, super-cap, direct solar cell, etc.), a rate of change for an output voltage may be relatively known. For instance, a lithium coin cell at ~3V may only use BOD checking when rising from a low power retention mode, or within a particular time period (e.g., hourly). In some instances, it may not be desirable to perform BOD checking in an always-on checking mode, e.g., for micro-second resolution. Sometimes, a direct solar cell source may use a more frequent BOD checking as it reacts to incident light, which may change rapidly. This duty-cycling feature may be useful for low voltage applications for which even ~275 nW is a significant overhead. In some situations, margining trip voltage may incur some costs (e.g., energy costs), as some devices may be disabled by BOD circuitry, even while there is still some useful energy in a power supply (e.g., a battery). To avoid static margin, trip voltage may be tuned by adjusting the bias resistors, which may be used in fuses or non-volatile memory (NVM) after test, or automatically using on-chip process monitors.

In accordance with aspects of the disclosure, BOD circuitry described herein may provide one or more or all of the following advantages. Using power gating to enable duty cycling may reduce static power dissipation. Sub-threshold operation may allow for ultra-low power in nano-ampere range. Added temperature compensation may reduce variation over temperature. One or more or all transistors may be thick-gate to assist with reducing process variation. Using resistors R1 and R2 may provide noise rejection from VDD and GND. Small foot-print of the BOD circuit may save on silicon area. Further, the BOD circuit may generate an error signal on both power-up and power-down, e.g., during rise-up or rise-down, respectively, of the input voltage VDD.

Described herein are various implementations of an integrated circuit. In one implementation, the integrated circuit may include a first stage having first transistors and resistors arranged to receive an input voltage and provide a first voltage that is substantially independent of temperature while remaining related to the input voltage. The integrated circuit may include a second stage having second transistors arranged to receive the input voltage and receive the first voltage from the first stage and up-convert the first voltage as the input voltage lowers. The second stage may be configured to provide a second voltage corresponding to a differential voltage of the input voltage and the first voltage. The integrated circuit may include a third stage having third transistors arranged to receive the second voltage and provide a high-gain output voltage corresponding to an error signal.

Described herein are various implementations of a brown-out detector. In one implementation, the brown-out detector detector may include a bias generator circuit configured to receive an input voltage, and provide an internal voltage that is substantially independent of temperature. The brown-out detector detector may include a differential up-converter circuit configured to receive the input voltage, receive the internal voltage from the first stage, up-convert the internal voltage as the input voltage lowers, and provide a differential voltage corresponding to a differential of the input voltage and the internal voltage. The brown-out detector detector may include a gain circuit configured to receive the differential voltage, and provide a high-gain output voltage corresponding to an error signal.

Described herein are various implementations of a brown-out detector. In one implementation, the brown-out detector may include first transistors and first resistors arranged to receive an input voltage and provide an internal voltage that is substantially independent of temperature. The brown-out detector detector may include second transistors arranged to receive the input voltage, receive the internal voltage, and up-convert the internal voltage as the input voltage lowers. The second transistors may be configured to provide a differential voltage corresponding to a differential of the input voltage and the internal voltage. The brown-out detector detector may include third transistors arranged to receive the differential voltage and provide a high-gain output voltage corresponding to an error signal.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a first stage having first transistors and resistors arranged to receive an input voltage and provide a first voltage that is substantially independent of temperature while remaining related to the input voltage;
   a second stage configured to provide a single-ended to differential up-converter circuit and having second transistors arranged to receive the input voltage and receive the first voltage from the first stage and up-convert the first voltage as the input voltage lowers, wherein the second stage is configured to provide a second voltage corresponding to a differential voltage of the input voltage and the first voltage; and
   a third stage having third transistors arranged to receive the second voltage and provide a high-gain output voltage corresponding to an error signal.

2. The integrated circuit of claim 1, further comprising an input transistor configured to operate as a switch for use as a power gating element, wherein the input transistor is configured to provide the input voltage to the first stage when the input transistor is activated, wherein the input transistor is configured to withhold the input voltage from the first stage when the input transistor is deactivated.

3. The integrated circuit of claim 1, further comprising an input transistor configured to operate as a switch for use as a power gating element, wherein the input transistor is configured to duty cycle the input voltage to the first stage when the input transistor is cycled through activation and deactivation over a period of time.

4. The integrated circuit of claim 1, wherein the first stage comprises a bias generator that is configured to bias the first transistors in sub-threshold using thick-gate transistors that are driven by the input voltage.

5. The integrated circuit of claim 1, wherein the resistors of the first stage comprise un-salicided poly resistors with a high-sheet resistance.

6. The integrated circuit of claim 1, wherein the resistors of the first stage comprise a positive temperature coefficient to offset a negative temperature coefficient of a threshold voltage of the first transistors.

7. The integrated circuit of claim 1, wherein the first stage comprises:
   a first resistor of the resistors and a first transistor of the first transistors arranged to provide a first current; and
   a second resistor of the resistors and a second transistor of the first transistors arranged to provide a second current that mirrors the first current.

8. An integrated circuit, comprising:
   a first stage having first transistors and resistors arranged to receive an input voltage and provide a first voltage that is substantially independent of temperature while remaining related to the input voltage, wherein the first stage comprises:
      a first resistor of the resistors and a first transistor of the first transistors arranged to provide a first current; and
      a second resistor of the resistors and a second transistor of the first transistors arranged to provide a second current that mirrors the first current;
   a second stage having second transistors arranged to receive the input voltage and receive the first voltage from the first stage and up-convert the first voltage as the input voltage lowers, wherein the second stage is configured to provide a second voltage corresponding to a differential voltage of the input voltage and the first voltage;

a third stage having third transistors arranged to receive the second voltage and provide a high-gain output voltage corresponding to an error signal; and wherein a threshold voltage variation of the first and second currents are cancelled out by the first resistor being connected between the first transistor and a first voltage rail supplying the input voltage and by the second resistor being connected between the second transistor and a second voltage rail supplying a ground voltage.

9. The integrated circuit of claim 1, wherein the second stage provides the second voltage as a combination of the input voltage and the up-converted first voltage corresponding to the differential voltage which is used to drive the third stage and provide the high-gain output voltage corresponding to the error signal.

10. The integrated circuit of claim 1, wherein the input voltage is 1.2 volts.

11. A brown-out detector, comprising:

first transistors and first resistors arranged to receive an input voltage and provide an internal voltage that is substantially independent of temperature;

second transistors arranged as a single-ended to differential up-converter to receive the input voltage, receive the internal voltage, and up-convert the internal voltage as the input voltage lowers, wherein the second transistors are configured to provide a differential voltage corresponding to a differential of the input voltage and the internal voltage; and third transistors arranged to receive the differential voltage and provide a high-gain output voltage corresponding to an error signal.

12. The brown-out detector of claim 11, further comprising an input transistor configured to operate as a switch for use as a power gating element, wherein the input transistor is configured to duty cycle the input voltage when the input transistor is cycled through activation and deactivation over a period of time.

13. The brown-out detector of claim 11, wherein the first transistors are biased in sub-threshold using thick-gate transistors that are driven by the input voltage, and wherein the first resistors are arranged to provide a positive temperature coefficient to offset a negative temperature coefficient of a threshold voltage of the first transistors.

14. A brown-out detector, comprising:

first transistors and first resistors arranged to receive an input voltage and provide an internal voltage that is substantially independent of temperature;

second transistors arranged to receive the input voltage, receive the internal voltage, and up-convert the internal voltage as the input voltage lowers, wherein the second transistors are configured to provide a differential voltage corresponding to a differential of the input voltage and the internal voltage; and third transistors arranged to receive the differential voltage and provide a high-gain output voltage corresponding to an error signal, wherein at least one of the first resistors and at least one of the first transistors are arranged to provide a first current, wherein at least one other of the first resistors and at least one other of first transistors are arranged to provide a second current that mirrors the first current, and wherein a threshold voltage variation of the first and second currents are cancelled out by the at least one of first resistors being connected between a first voltage rail supplying the input voltage and the at least one of the first transistors and by the at least one other of the first resistors being connected between a second voltage rail supplying a ground voltage and the at least one other of the first transistors.

15. The brown-out detector of claim 11, wherein the second transistors are configured to provide the differential voltage as a combination of the input voltage and the up-converted internal voltage corresponding to the differential voltage which is used to drive the third transistors and provide the high-gain output voltage corresponding to the error signal.

* * * * *